United States Patent [19]

Barndt, Sr.

[11] Patent Number: 4,763,338
[45] Date of Patent: Aug. 9, 1988

[54] SYNCHRONOUS SIGNAL DECODER

[75] Inventor: Robert A. Barndt, Sr., Coatesville, Pa.

[73] Assignee: Unisys Corporation, Blue Bell, Pa.

[21] Appl. No.: 87,532

[22] Filed: Aug. 20, 1987

[51] Int. Cl.⁴ .......................................... H04L 27/22
[52] U.S. Cl. ........................................ 375/82; 375/87
[58] Field of Search ............... 375/49, 80, 82, 83, 375/87; 360/42, 43; 329/104, 107; 455/608

[56] References Cited

U.S. PATENT DOCUMENTS

| | | | |
|---|---|---|---|
| 3,271,750 | 9/1966 | Padalino | 360/42 |
| 3,437,932 | 4/1969 | Malakoff | 375/49 |
| 4,185,273 | 1/1980 | Gowan | 375/87 |
| 4,320,525 | 3/1982 | Woodward | 375/87 |
| 4,513,427 | 4/1985 | Borriello et al. | 375/87 |

Primary Examiner—Benedict V. Safourek
Attorney, Agent, or Firm—Albert B. Cooper; Arnold L. Albin; Laurence J. Marhoefer

[57] ABSTRACT

A synchronous decoder for recovering a train of binary data encoded in a biphase format and decoding into NRZ format. Encoded data is sampled during the first half of a bit period and the second half of a bit period and stored respectively into two storage elements. The stored data is combined and applied to a third storage element at the beginning of the next bit period. The state of the third storage element is responsive to the sequentially applied combined signals in the train of data and thereby produces a pulsed output encoded in NRZ format.

10 Claims, 2 Drawing Sheets

SYNCHRONOUS SIGNAL DECODER

BACKGROUND OF THE INVENTION

1. Field of the Invention

The present invention relates generally to a detector for serial data transmission and more particularly to a synchronous decoder for fiber-optic signals wherein data and clock rate have been encoded together.

2. Description of the Prior Art

Present day digital data transmission systems typically recover binary data by transmitting and detecting binary encoded electrical signal waveforms. Transmission of signals over fiber-optic lines offers several advantages over copper transmission lines. Thus, fiber transmission lines possess wide bandwidths which permit multiplexing a plurality of signals with minimum losses, are compact, and immune to electromagnetic interference. The simplest method of transmission is by intensity modulation of a light source which is applied to the fiber transmission line and detected by an appropriate sensor. However, transmission over appreciable distances results in phase shift due to perturbations in the optical fiber, variations in the thickness of the jacket surrounding the fiber and the effects of mechanical stimuli which result in changes in the index of refraction. As a result, it is desirable to buffer, periodically detect, and reconstruct the transmitted signal so that it replicates the original transmission. By this means, signals can be transmitted over fiber-optic lines of significant length with minimal distortion.

The choice of the code used for transmitting the fiber-optic signals is of importance in order to obtain maximum achievable data density with minimium phase distortion. Further, in applications where remote terminates or work stations are fed from a centrally disposed computer, it is desirable to transmit a clock frequency for synchronizing the remote stations with the computer. The method of encoding known as biphase, which is similar to phase modulation, frequency shift, and manchester codes, produces a waveform from which both data and clock frequency may be recovered. Biphase zero is a self-clocking signal data transmission code characterized by always changing logic state at the end of the bit time period, but if the bit is a zero, also changing at mid-bit. Thus, a train of successive logic ones would be represented by alternating logic zero and logic one bit pulses, while a logic zero would be comprised of a comparable bit period wherein the logic state changes substantially in the middle of the bit.

An apparatus for generating biphase data signals, and asynchronously recovering the data, is shown in U.S. Pat. No. 4,584,719, Fiber Optic Workstation Datalink Interface, issued Apr. 22, 1986 to B. J. Miller, which is incorporated herein by reference.

The present invention provides an apparatus for synchronously decoding biphase data in accordance with a system clock and providing an output encoded in accordance with the well known NRZ format. Thus, it is adaptable to utilization between electrical signals generated, for example, in RS-422A format, which are converted to fiber-optic signals for transmission over fiber-optic lines, and then detected by the present invention, and the NRZ output decoded to regenerate the electrical signals.

SUMMARY OF THE INVENTION

The present invention provides an apparatus for decoding a train of sequential pulses encoded in biphase format in synchronism with a predetermined clock rate. The apparatus includes first and second digital storage circuits which receive the phase-encoded signals and provide outputs corresponding to the beginning portion and the ending portion of the binary bit signals. The outputs corresponding to the binary bit signals are applied to a gate, such that an output is produced only when the applied signals are in opposing binary states. The gated signal is further applied to an inverter and the inverted and noninverted signals which define the beginning of the binary bit signal and the end of the binary bit signal, respectively, are applied to a digital switch which changes state in response to the sequentially applied signals so as to provide a decoded output signal whose logic state corresponds to the applied binary bit signal, thereby providing a logic one output when the applied binary bit signal is in a logic one state, and a logic zero output when the applied binary bit signal is in a logic zero state, as defined by the biphase input signal. The time interval between changes between the first and second logic states corresponds to multiples of the binary bit period.

DESCRIPTION OF THE PREFERED EMBODIMENT

In the following description the present invention is applied to the decoding of fiber optical signals encoded in biphase format. It should be appreciated that signals in this format also provide information with respect to an embeded data clock frequency utilized by a work station; however, the present invention is concerned primarily with the decoding of the biphase signal and conversion to NRZ data in synchronism with a provided clock signal. Thus, recovery of the data clock frequencies are not herein involved.

The present invention is adapted for synchronization with an incoming data stream so that the receiving interface will detect when data bits (binary ones and zeros) will occur. A 16 MHZ system clock is used for illustrative purposes, although this clock rate is exemplary and not to be construed as limiting. A binary one is represented by a period nine clock pulses in duration of logic zero or logic one value, with a stream binary ones represented by sequentially alternating periods of logic one and logic zero values. A binary zero is represented by a first portion four clock pulses in duration having a logic zero value an a second portion of five clock pulses having a logic one value. Each character transmitted during a bit period is encoded with a data clock frequency. Since each character is individually encoded, a dynamically changing data clock may be utilized.

Figure 1:
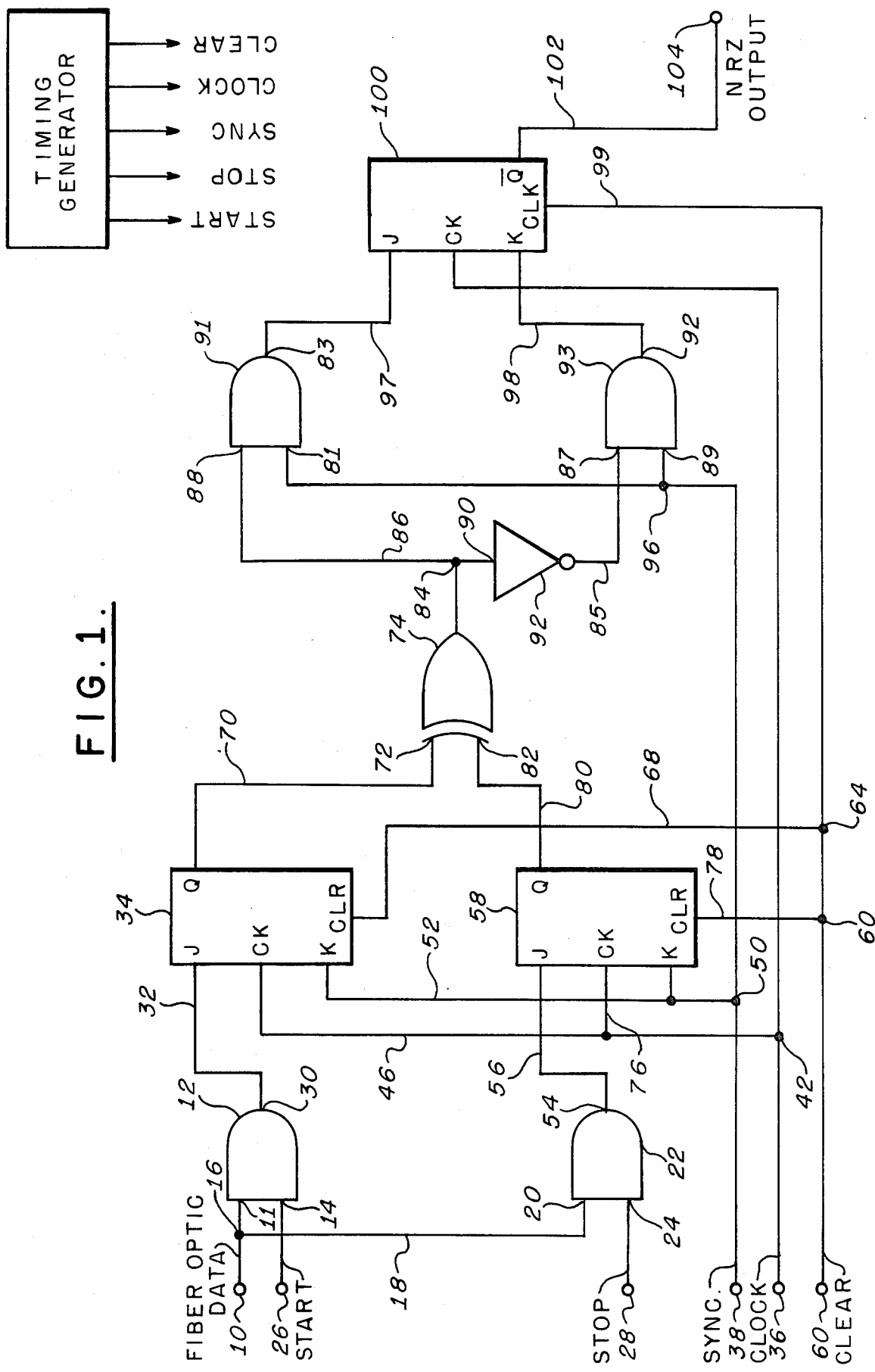
FIG. 1 is a schematic block diagram illustrating the apparatus of the present invention.

Referring now to FIG. 1, there is illustrated a schematic block diagram of the logic elements forming the present invention. Biphase serial signal data, such as digital fiber-optic data, is applied at terminal 10 to input 11 of AND gate 12. The biphase data is also transmitted from node 16 along line 18 to input 20 of a second AND gate 22. A start signal denoting the beginning of a character is applied to input 26 and a second terminal 14 of AND gate 12. In a similar manner, a stop signal denoting the end of the character is applied to the terminal 28 and input 24 of AND gate 22. The start and stop signals may be derived from a timing generator source gated by an internal clock and which has been programmed with the anticipated character structure, which needs at some point in time to be synchronized, prior to being applied to node 16, with the incoming data rate.

The output 30 of AND gae 12 is applied on line 32 to terminal J of logic element 34. Element 34 is a bistable multivibrator, such as the type 74LS107JK flip-flop which triggers on the falling edge of a clock signal applied to terminal CK. Flip-flop 34 is cleared and the output at terminal Q set to a logic zero condition by a clear signal at initialization applied to terminal 60 and conducted on lines 62 and 68 to the CLR terminal. The clock signal is applied at terminal 36 in a conventional manner to lines 40 and 46 coupled terminal CK. A synchronization signal sync is applied at terminal 38 to line 48 and line 52 to input K of flip-flop 34 and flip-flop 58. The synchronization signal is generated by the timing generator described above. The output Q of flip-flop 34 is applied on line 70 to input 72 of XOR gate 74. XOR gate 74 is a conventional logic element such a type 74LS86.

Output terminal 54 of AND gate 22 is coupled on line 56 to the J terminal of a second bistable multivibrator 58, also in the form of a JK flip-flop. The clock signal 36 is applied from node 42 to lead 76 and input terminal CK. The clear signal on line 62 is coupled from node 66 to line 78 and terminal CLR at initialization. Output Q of flip-flop 58 is coupled on lead 80 to a second input 82 of XOR gate 74.

XOR gate 74 has an output coupled at node 84 on line 86 to one input 88 of a third AND gate 91. Node 84 is also coupled to input 90 of an inverter 92. A second input 81 of AND gate 91 receives the sync signal applied to terminal 38 via line 48, node 96, and line 94. The output 83 of AND gate 91 is coupled on line 97 to the J terminal of a third bistable multivibrator 100, which is preferably a type 74LS112. Multivibrator 100 is also of the JK flip-flop type, and is triggered on the falling edge of the input clock pulse. The output of inverter 92 is applied on line 85 to input 87 of a fourth AND gate 93. The sync signal from terminal 38 is applied via line 48 and node 96 to a second input 89 of AND gate 93. The output 95 of AND gate 93 is coupled via line 98 to terminal K of flip-flop 100. The clear signal on line 62 is applied via node 64 and line 99 to terminal CLR of flip-flop 100. The output from flip-flop 100 is taken from the $\overline{Q}$ terminal. The output $\overline{Q}$ is applied on line 102 to provide a decoded signal in NRZ format at terminal 104.

Figure 2:
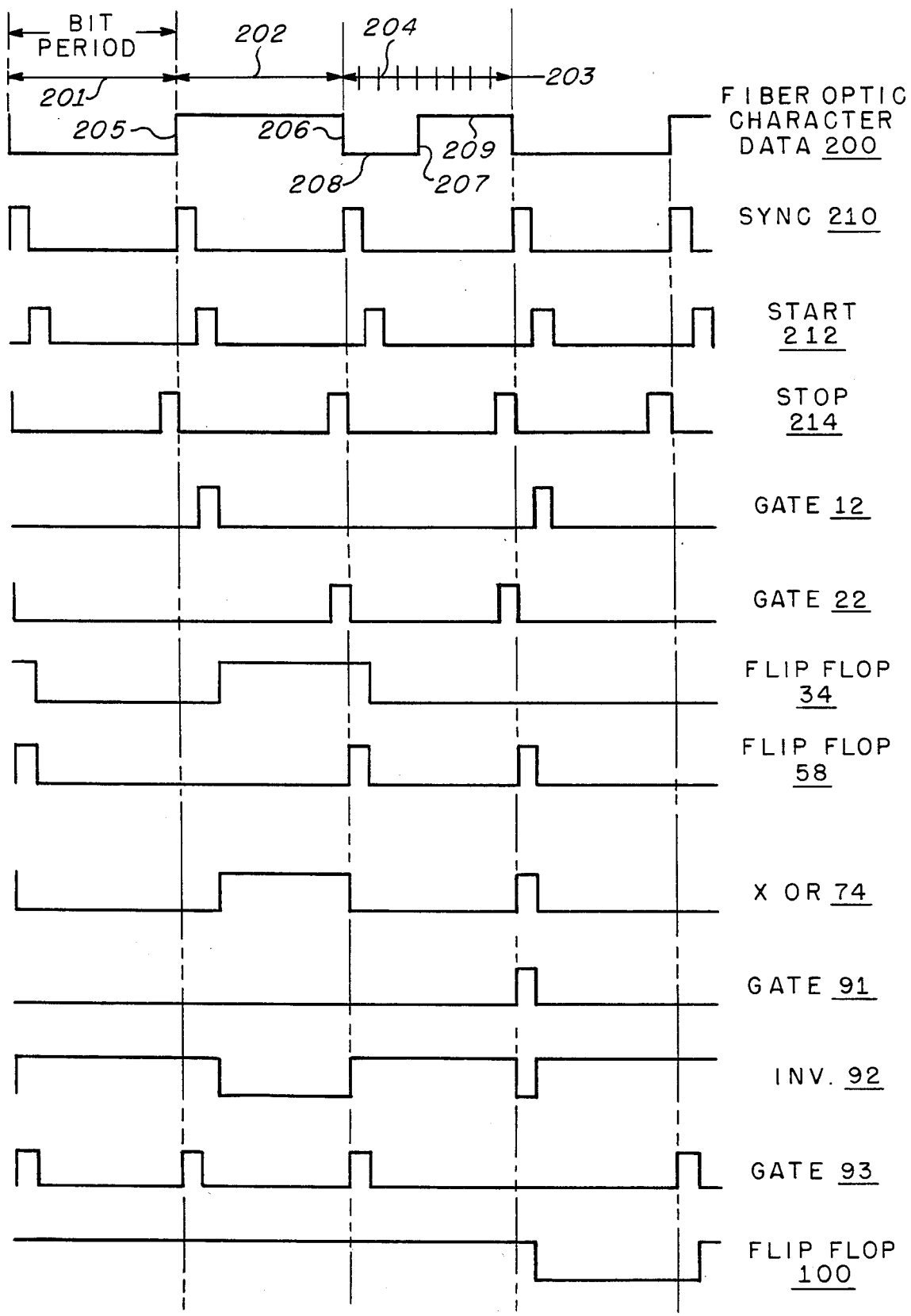
FIG. 2 is a timing diagram illustrating the signal relationships at various points within the present invention.

Having described the structure of the invention, the operation of the circuit will now be explained. Referring now to FIG. 2, with continued reference to FIG. 1, there are shown the signal waveforms appearing at various points of the circuit of FIG. 1. Thus, fiber-optic character data 200 is of the biphase zero format. Each of the bit periods 201, 202, and 203 is comprised of nine clock pulses. Bit period 203 is marked to show nine clock pulses 204 of equal duration. Period 201 denotes a binary one character, which is shown at a logic level zero. Period 202, which also depicts a binary one character, is denoted by a logic one. A transition 205 marks the end of one bit period and the beginning of the next bit period. Period 203 represents a binary zero character and is comprised of a first portion 208, at a logic zero level, a transition 207 to a logic one level, and a second portion 209.

The fiber-optic character data is applied on terminal 10 to AND gates 12 and 22. At the beginning of each valid character, a synchronization pulse SYNC 210 is generated. The SYNC signal is delayed by one clock interval from a START signal 212 which is applied to terminal 26. With reference to interval 203, the signal represented by the first portion 208 is combined in AND gate 12 with START pulse 212, and as shown at the waveform GATE 12, results in zero output level. SYNC pulse 210 is applied to reset flip-flop 34 and flip-flop 58 on the trailing edge of the next clock pulse. It may be seen by referring to waveform FF.34 that the output of gate 12 previously stored in flip-flop 34 was a logic high. Therefore, when reset by the SYNC pulse 210, flip-flop 34 is pulled to a logic low condition on the next clock cycle. Therefore, the output at terminal Q is a logic low. Also, since the resultant Q output from gate 12 is low, because the biphase signal 208 was low at the time of START pulse 212 when flip-flop 34 was reset by SYNC pulse 210, on the trailing edge of the next clock pulse there is no output pulse from gate 12; therefore, the Q output of flip-flop 34 stays low. Thus, the logic condition of the first portion 208 of the character represented by bit period 203 has been stored in flip-flop 34.

At the end of each character a STOP pulse 214 is generated and applied to input 24 of AND gate 22. When combined with the second portion 209 of the CHARACTER DATA 200 in gate 22, the result is the waveform shown by GATE 22. For this portion of the character, a logic high results.

The output of gate 22 is a one clock-wise pulse which on its trailing edge and at the next clock pulse causes flip-flop 58 to go to a logic high condition. This is shown in waveform FF.58. It may be seen that flip-flop 58 was at a logic high condition as a result of the STOP signal 214 applied during the previous bit period 202, but on the next clock pulse and as a result of the SYNC pulse 210 flip-flop 58 is reset. Since terminal J coupled to AND gate 22 is at a logic zero level at this time, flip-flop 58 was pulled to a logic zero level. Thus, when flip-flop 58 is again pulsed by the clock signal and a logic high applied to terminal J from gate 22, the output of flip-flop 58 goes high occuring at the downside transition of the next clock pulse. It may be seen that a logic low condition is now stored in flip-flop 34 and a logic high condition in flip-flop 58.

The logic low output Q of flip-flop 34 is applied on line 70 to input 72 of XOR gate 74, and combined with the logic high output Q of flip-flop 58 applied on line 80 to input 82 of XOR 74. The result is a pulse of one clock width shown at waveform XOR74. The output 84 of XOR gate 74 is applied on line 86 to terminal 88 of AND gate 91 and combined with the sync pulse applied to terminal 81. Since both inputs occur simultaneously, the output 83 of gate 91 is a one clock-width pulse which is applied on line 97 to the J input of flip-flop 100. Simultaneously with the storage of the XOR signal in flip-flop 100, the SYNC pulse 210 is applied to flip-flops 34 and 58, so that on the same clock pulse that changes the state of flip-flop 100, flip-flops 34 and 58 are also reset, so that they are prepared to accept the following characters in the bit stream. Output 84 is also applied to an inverter 92 and the inverted resultant applied to input 87 of AND gate 93. The sync signal at terminal 89 is combined with the output of inverter 92 in AND gate 93 and the resulting logic zero is applied to the K input of flip-flop 100. The previous data that had been decoded was a stream of ones, so that the output Q of flip-flop 100 was at a logic high, as shown in waveform FF.100. However, when the logic high pulse from gate 91 is applied to flip-flop 100, the next clock pulse applied will set flip-flop 100, causing the complementary output Q to go to a logic low. This logic low is representative of the NRZ zero character at interval format, a logic low means a binary zero and a logic high means a binary one. If interval 203 is followed by a successive zero character the NRZ output would remain at a logic low level. Further, if the following character is a binary one, then the NRZ output will return to a logic high. It may be seen that the NRZ output of waveform FF.100 when viewed in relationship to the encoded data 200 is delayed by one character.

While the invention has been described in its preferred embodiments it is to be understood that the words which have been used are words of description rather than limitation and that changes may be made within the purview of the appended claims without departing from the true scope and spirit of the invention in its broader aspects.

What is claimed is:

1. A synchronuous detector for phase-encoded binary signals comprised of a plurality of sequential pulses, ones of said sequential pulses encoded to designate a binary logic state in synchronism with a predetermined clock rate, said synchronous detector comprising:

first digital storage means for providing a first output signal in accordance with the logic state of a first predetermined portion of one of said binary signals having first and secnd portions, second digital storage means for providing a second output signal in accordance with the logic state of a second predetermined portion of said one of said binary signals;

said first and second predetermined portions of said one binary signal comprising a binary character of predetermined duration;

gate means responsive to said first and second output signals for providing a third output signal when said first and second output signals are in opposing binary states, and for producing a null output when said first and second output signals are in the same binary state;

means for inverting said third output signal; and digital switch means responsive to said third output signal and said inverted third output signal for providing a further output signal indicative of the logic state of said one of said binary signals, said third output signal corresponding to a first transition demarking the beginning of said binary signal and said inverted output signal corresponding to a second transition demarking the end of said binary signal, said switch means so constructed and arranged as to change to a first logic state said third output signal is applied and to an opposing logic state when said inverted output signal is sequentially applied, the time interval between said first and second logic states corresponding to multiples of a period corresponding to a binary character.

2. The synchronous detector as set forth in claim 1, further comprising first AND gate means, responsive to said one of said phase-encoded binary signals and to a timing signal representative of said first predetermined portion thereof, for providing an output signal to said first digital storage means when said timing signal and said phase-encoded binary signal are in logic state coincidence.

3. The synchronous detector as set forth in claim 2, further comprising second AND gate means responsive to said one of said phase-encoded binary signals and to a further timing signal representative of said second portion thereof, for providing an input signal to said second digital storage means when said further timing signal and said phase-encoded binary signal are in logic state coincidence.

4. The synchronous detector as set forth in claim 3, said first digital storage means comprised of first bistable multivibrator means, also responsive to a source of clock signals and to a still further timing signal corresponding to a duration of said binary character.

5. The synchronous detector as set forth in claim 4, said second digital storage means comprised of second bistable multivibrator means, also responsive to said source of clock signals and said still further timing signal.

6. The synchronous detector as set forth in claim 5, said gate means comprised of an EXCLUSIVE OR gate.

7. The synchronous detector as set forth in claim 6, further comprising third AND gate means responsive to said third output signal and to said still further timing signal for providing a first input signal to said digital switch means corresponding to a coincidence of said third output signal and said still further timing signal.

8. The synchronous detector as set forth in claim 7, further comprising fourth AND gate means responsive to said inverted third output signal and to said still further timing signal, for providing a second input signal to said digital switch means corresponding to a coincidence of said inverted third output signal and said still further timing signal.

9. The synchronous detector as set forth in claim 8, said digital switch means further comprising third bistable multivibrator means responsive to said source of clock signals.

10. The synchronous detector as set forth in claim 9, wherein said first, second, and third multivibrator means comprise J-K flip-flop means.

* * * * *